United States Patent
Senzaki et al.

(10) Patent No.: US 6,500,499 B1
(45) Date of Patent: Dec. 31, 2002

(54) DEPOSITION AND ANNEALING OF MULTICOMPONENT ZRSNTI AND HFSNTI OXIDE THIN FILMS USING SOLVENTLESS LIQUID MIXTURE OF PRECURSORS

(75) Inventors: Yoshihide Senzaki, Carlsbad, CA (US); Arthur Kenneth Hochberg, Solana Beach, CA (US); David Allen Roberts, Encinitas, CA (US); John Anthony Thomas Norman, Encinitas, CA (US); Glenn Baldwin Alers, Santa Cruz, CA (US); Robert McLemore Fleming, Chatham, NJ (US)

(73) Assignee: Air Products and Chemicals, Inc., Allentown, PA (US)

( * ) Notice: Subject to any disclaimer, the term of this patent is extended or adjusted under 35 U.S.C. 154(b) by 0 days.

(21) Appl. No.: 09/522,634

(22) Filed: Mar. 10, 2000

(51) Int. Cl.[7] .............................. B05D 3/06; B05D 1/34; C23C 16/40; C23C 16/56
(52) U.S. Cl. ...................... 427/539; 427/558; 427/559; 427/226; 427/255.32; 427/255.36
(58) Field of Search ................................. 427/539, 535, 427/553, 559, 558, 226, 255.31, 255.36, 255.32

(56) References Cited

U.S. PATENT DOCUMENTS

| | | | |
|---|---|---|---|
| 4,058,430 A | | 11/1977 | Suntola et al. .............. 156/611 |
| 4,731,611 A | * | 3/1988 | Müller et al. ................. 324/28 |
| 5,204,314 A | | 4/1993 | Kirlin et al. .................... 505/1 |
| 5,559,363 A | * | 9/1996 | Immorlica, Jr. ............. 257/664 |
| 5,820,664 A | | 10/1998 | Gardiner et al. ....... 106/287.17 |
| 5,912,797 A | * | 6/1999 | Schneemeyer et al. ..... 361/311 |

FOREIGN PATENT DOCUMENTS

WO 9846617 10/1998 .......... C07F/19/00

OTHER PUBLICATIONS

"Advances in Processing of Ferrelectric Thin Films", L.M. Sheppard, *Ceramic Bulletin*, vol. 71, No. 1, ('92), pp. 85–95, 1992, No Month.

"Formation of $Al_2O_3$–$Ta_2O_5$ Double–Oxide Thin Films by Low–Pressure MOCVD and Evaluation of Their Corrosion ResistanceS in Acid and Alkali Solutions", Hara, et al, *Journal of the Electrochemical Society*, 146 (2) ('99) pp. 510–516, No Month.

"High Coercivity in $Sm_2Fe_{17}N_x$ Magnets", Schnitzke, et Al, *Appl. Phys. Lett.* 57(26) Dec. 24, 1990, pp. 2853–2855.

"Investigation of Ternay Transition–Metal Nitride Systems by Reactive Cosputtering", Van Dover, et al, *Chem. Mater.* ('93) vol. 5, pp. 32–35, No Month.

"Reactively Sputtered Ti–Si–N Films II. Diffusion Barriers for Al and Cu Metallization on Si," Sun, et al, *J. Appl. Phys.* 81 (2) Jan. 15, 1997, pp. 664–671.

(List continued on next page.)

Primary Examiner—Marianne Padgett
(74) Attorney, Agent, or Firm—Geoffrey L. Chase

(57) ABSTRACT

Complex mixed metal containing thin films can be deposited by CVD from liquid mixtures of metal complexes without solvent by direct liquid injection and by other precursor dispersing method such as aerosol delivery with subsequent annealing to improve electrical properties of the deposited films. This process has potential for commercial success in microelectronics device fabrication of dielectrics, ferroelectrics, barrier metals/electrodes, superconductors, catalysts, and protective coatings. Application of this process, particularly the CVD of ZrSnTiOx (zirconium tin titanate, or ZTT) and HfSnTiOx (hafnium tin titanate, or HTT) thin films has been studied successfully.

18 Claims, 1 Drawing Sheet

OTHER PUBLICATIONS

"*MOCVD Routes to Thin Metal Oxide Films for Superconducting Electronics*", Schulz, et al, *Adv. Mater.* ('94), 6 No. 10, pp. 719–730, No Month.

"*Compositional and Microstructural Characterization of $RuO_2$–$TiO_2$ Catalysts Synthesized by the Sol–Gel Method*", Guglielmi, et al, J. Electrochem. Soc., vol. 139, No. 6, Jun. 1992, pp. 1665–1661.

"*Enhancement of the Dielectric Constant of $Ta_2O_5$ Through Substitution With $TiO_2$*", Cava, et al, Nature, vol. 377 Sep. 21, 1995, pp. 215–217.

"*New Liquid Precursors for Chemical Vapor Deposition*", Gordon et al, *Mater. Res. Soc. Symp. Proc.*, 495, pp. 63–68 Fall 1997 (No Specific Month).

"*Liquid Compounds for CVD of Alkaline Earth Metals*", Gordon, et al, *Mat. Res. Soc. Symp. Proc.*, vol. 574 ('99), MRS Meeting, Apr. 7, 1999, San Francisco, CA.

* cited by examiner

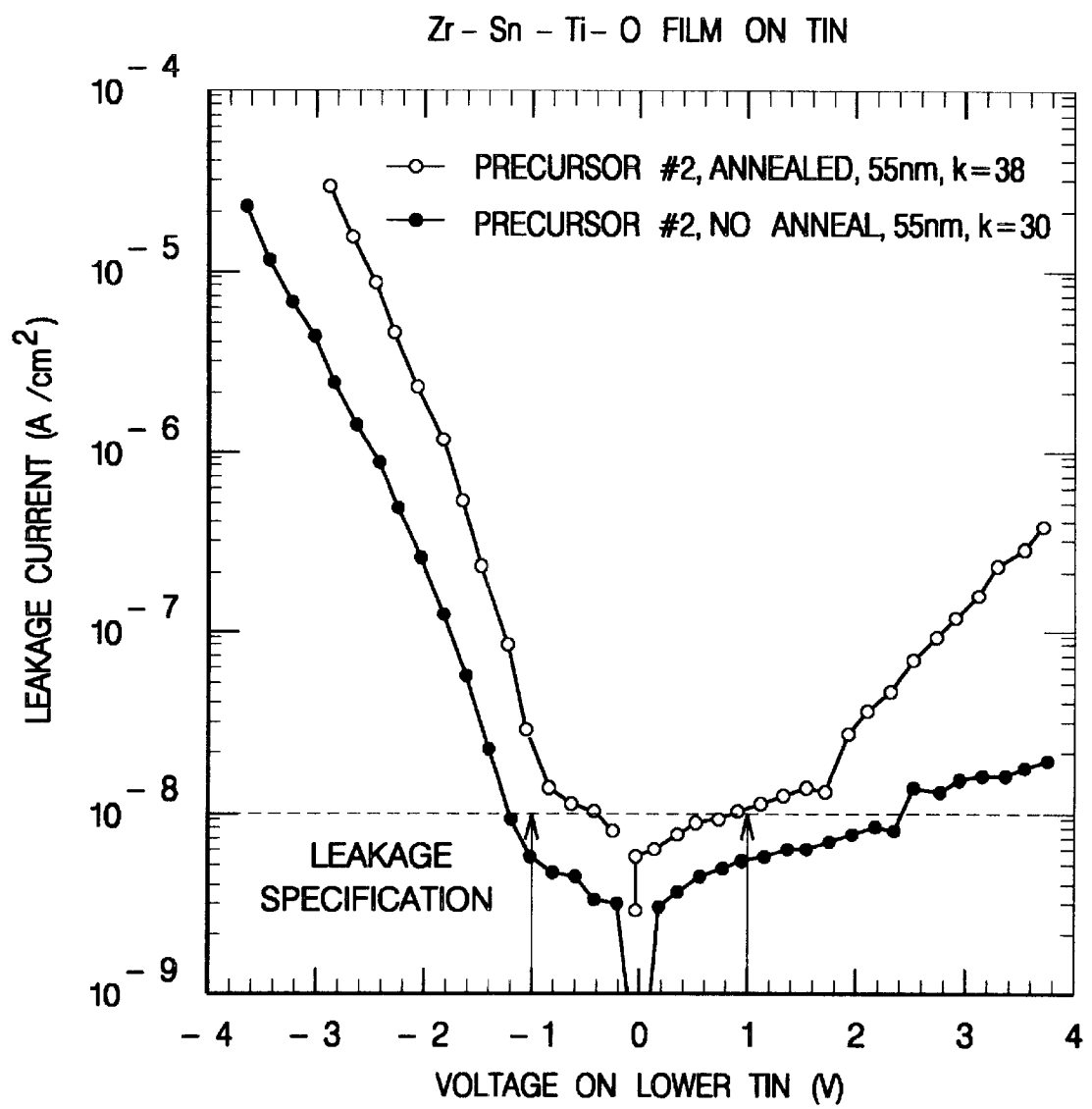

DEPOSITION AND ANNEALING OF MULTICOMPONENT ZRSNTI AND HFSNTI OXIDE THIN FILMS USING SOLVENTLESS LIQUID MIXTURE OF PRECURSORS

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

The semiconductor fabrication industry requires materials and deposition technology adequate to deposit metals, metal mixtures and metal compound mixtures in thin layers, plugs, vias and patterns on semiconductor and insulating or dielectric substrates to make appropriate electrical devices for integrated circuits, memory devices and flat panel display devices.

Various techniques are known for depositing metals, metal compounds and their mixtures on appropriate electronic materials substrates, including; physical methods (sputtering, molecular beam epitaxy, evaporation and laser ablation), alloying, and chemical vapor deposition (plasma, photo or laser enhanced, low pressure and high temperature).

Various multiple metal oxides are known in the literature, including those recited in: "Advances in Processing of Ferroelectric Thin Films", L. M. Sheppard, Ceramic Bulletin, Vol. 71, No. 1, (1992), pp. 85–95; "Formation of $Al_2O_3$—$Ta_2O_5$ Double-Oxide Thin Films by Low-Pressure MOCVD and Evaluation of Their Corrosion Resistances in Acid and Alkali Solutions", Hara, et. al., Journal of the Electrochemical Society, 146 (2) (1999), pp. 510–516; "High Coercivity in $Sm_2Fe_{17}N_x$ Magnets", Schnitzke, et. al., Appl. Phys. Lett. 57 (26) Dec. 24, 1990, pp. 2853–2855; "Investigation of Ternary Transition-Metal Nitride Systems by Reactive Cosputtering", Van Dover, et. al., Chem. Mater. (1993), Vol. 5, pp. 32–35; "Reactively Sputtered Ti—Si—N Films II. Diffusion Barriers for Al and Cu Metallizations on Si", Sun, et. al., J. Appl. Phys., 81 (2) Jan. 15, 1997, pp. 664–671; "MOCVD Routes to Thin Metal Oxide Films for Superconducting Electronics", Schulz, et. al., Adv. Mater. (1994), 6 No. 10, pp. 719–730; "Compositional and Microstructural Characterization of $RuO_2$—$TiO_2$ Catalysts Synthesized by the Sol-Gel Method", Guglielmi, et. al., J. Electrochem. Soc., Vol. 139, No. 6, June 1992, pp. 1665–1661; "Enhancement of the Dielectric Constant of $Ta_2O_5$ Through Substitution with $TiO_2$", Cava, et. al., Nature, Vol. 377, 21, September 1995, pp. 215–217; and U.S. Pat. No. 4,058,430, the latter of which also discloses the deposition process known as "atomic layer epitaxy".

Chemical vapor deposition (CVD) has gained favor in recent years due to its properties of providing uniform and conformal deposition and its ability to deposit an array of materials under highly controllable conditions. Typically, chemical vapor deposition can provide high deposition rates of high purity materials in a controlled fashion.

However, chemical vapor deposition has several drawbacks which make its implementation challenging. Not all desired chemicals are sufficiently volatile to make themselves amenable to chemical vapor deposition. Some chemicals are solids at storage or delivery conditions. Some chemicals are too volatile for adequate storage and delivery.

The situation for chemical vapor deposition is further complicated by the need to co-deposit several chemicals, such as multiple metal oxide chemical vapor deposition. It is possible for metal precursors to react with one another or for at least one metal precursor for CVD to be too volatile or too involatile, i.e., a solid.

To overcome these disadvantages of CVD, the prior art has used solvents to dissolve solid metal precursors or blend liquid, particularly viscous liquid, metal precursors for CVD.

U.S. Pat. No. 5,204,314 discloses a foraminous device for flash vaporization of liquid mixtures or solvent mixtures of metal precursors for CVD.

U.S. Pat. No. 5,820,664 describes various solvent mixtures of mixed metal compound precursors, which are useful for CVD.

However, solvent systems for liquid delivery for CVD are problematic because compatible, volatile solvents must be chosen. Solvents decrease the amount of effective reagent that is delivered to the CVD reactor for a given flow and time period. More importantly, solvents introduce yet another reagent into the sensitive reaction zone where delicate semiconductor and electronic device fabrication is being performed. The adverse effects of such solvent presence must be considered. Finally, solvents represent an environmental and cost factor. The solvent or its degradation products must be recycled, captured or treated subsequent to utilization.

International Patent Application WO98/46617 describes metal precursors and processes for deposition of metal oxides from mixed β-diketonates. The application addresses liquid delivery of metal precursors for CVD and other depositions by direct liquid injection. Using mixed β-diketonates enhances the liquid state of the precursors to facilitate delivery. Solvents are an option for the liquid mixtures. Similar disclosures appeared in "New Liquid Precursors for Chemical Vapor Deposition", Gordon, et. al., Mater. Res. Soc. Symp. Proc., 495, (1998), pp. 63–68; and "Liquid Compounds for CVD of Alkaline Earth Metals", Gordon, et. al., Mat. Res. Soc. Symp. Proc., Vol. 574 (1999), MRS Meeting, Apr. 7, 1999, San Francisco, Calif. These metal β-diketonates are highly viscous materials at room temperature, which complicates the precursor delivery.

The prior art attempts to provide appropriate liquid media for metal precursor delivery have required the use of selected solvents or mixed β-diketonate ligands to assure liquid conditions for delivery. Solvents constitute problems of contamination and abatement. Mixed ligands constitute problems of inadvertent ligand exchange which can lead to non-liquid conditions. The β-diketonate ligands frequently lead to solid metal compounds absent manipulation of the β-diketonate substituents to avoid conditions leading to solid conditions, thus aggravating the consequences of inadvertant ligand exchange. The present invention overcomes these drawbacks by using a solventless, common ligand mixture of metals in a liquid state for deposition preferably by direct liquid injection to avoid solvent and ligand exchange drawbacks for consistent deposition performance, with subsequent annealing to improve electrical properties of the deposited films.

SUMMARY OF THE INVENTION

The present invention is a process for the deposition of XSnTi oxide containing thin films from solventless liquid mixtures of $X(L)_4$, $Sn(L)_4$ and $Ti(L)_4$ containing precursors, where X=Zr or Hf, comprising;

(a) providing $X(L)_4$, $Sn(L)_4$ and $Ti(L)_4$ precursors in a solventless liquid mixture, wherein L is selected from the group consisting of alkyls, alkoxides, halides, hydrides, amides, imides, azides, cyclopentadienyls, carbonyls, carboxylates, thiolates, nitrates, phosphates, metal β-diketonates, metal β-ketoiminates, metal β-diiminates and their fluorine and other substituted analogs and mixtures thereof;

(b) introducing the $X(L)_4$, $Sn(L)_4$ and $Ti(L)_4$ precursors as a solventless liquid mixture into a reaction zone and adjacent a substrate upon which a thin film is to be deposited, along with a reactant selected from the group consisting of oxygen containing reactants, nitrogen containing reactants and mixtures thereof;

(c) depositing a thin film of XSnTi oxide having a dielectric constant greater than 20 on the substrate under appropriate reaction conditions.

(d) annealing the films at a temperature in the range of approximately 200–500° C., in an anneal gas selected from the group consisting of $N_2$, Ar, He, $O_2$, $O_3$, $N_2O$, NO, $H_2O$, $H_2O_2$ and mixtures of thereof.

Preferably, X=Zr and the ratio of Zr:Sn:Ti= 0.1–0.3:0.1–0.3:0.4–0.8.

Alternatively, X=Hf and the ratio of Hf:Sn:Ti= 0.05–0.30:0.01–0.20:0.50–0.94.

Preferably, the appropriate reaction conditions of elevated temperature are approximately 150–600° C. More preferably, the appropriate reaction conditions of elevated temperature are approximately 200–500° C.

Preferably, the solventless liquid mixture is introduced into the reaction zone and vaporized at a temperature of approximately 50–200° C. More preferably, the temperature is approximately 80–120° C.

Preferably, the reaction zone pressure is approximately 0.01–50 Torr. More preferably, the pressure is approximately 0.1–5 Torr.

Preferably, the deposition rate of the thin film is in the range of approximately 1 to 300 angstoms per minute.

More specifically, the present invention is a process for the deposition of XSnTi oxide containing thin films, where X=Zr or Hf, from solventless liquid mixtures of, $X(L)_4$, $Sn(L)_4$, $Ti(L)_4$ where L=OR or $NR_2$, and R=H or $C_1-C_6$ alkyls and substituted alkyls comprising;

(a) providing $X(L)_4$, $Sn(L)_4$, $Ti(L)_4$ as a solventless liquid mixture;

(b) introducing the $X(L)_4$, $Sn(L)_4$, $Ti(L)_4$ as a solventless liquid mixtures into a reaction zone and adjacent a substrate upon which a thin film is to be deposited, along with an oxygen containing reactant;

(c) depositing a thin film of XSnTi oxides having a dielectric constant greater than 20 on the substrate under appropriate reaction conditions of elevated temperature;

(d) annealing the films at a temperature in the range of approximately 200–500° C., in an anneal gas selected from the group consisting of $N_2$, Ar, He, $O_2$, $O_3$, $N_2O$, NO, $H_2O$, $H_2O_2$ and mixtures of thereof.

Preferably, the oxygen containing reactant is selected from the group of oxygen, ozone, nitrous oxide, nitric oxide, nitrogen dioxide, water, hydrogen peroxide, air and mixtures thereof.

The present invention is further a process of thermal treatment of deposited XSnTi oxide thin films, where X=Zr or Hf, to improve electrical properties of the films, comprising annealing the films at a temperature in the range of approximately 200–500° C. in an anneal gas selected from the group consisting of $N_2$, Ar, He, $O_2$, $O_3$, $N_2O$, NO, $H_2O$, $H_2O_2$ and mixtures of thereof, conducting the annealing for a time in the range of approximately 1–60 min.

Preferably, the annealing is conducted for a time in the range of 5–30 min.

Preferably, the annealing is performed at a temperature in the range of approximately 350–450° C.

Preferably, the thin film of XSnTi oxides are deposited as a storage capacitor in a dynamic random access memory device.

BRIEF DESCRIPTION OF SEVERAL VIEWS OF THE DRAWINGS

FIG. 1 is a graph of IV (current-voltage) of a Zr—Sn—Ti—Ox (zirconium tin titanate or ZTT) film of the present invention before and after anneal per Example 4.

DETAILED DESCRIPTION OF THE INVENTION

Multicomponent metal containing materials, such as mixed-metal oxides, often have unique physical properties that each individual metal oxide component does not possess. For example, some mixed metal oxides can be used for high dielectric constant materials, ferroelectrics, high temperature superconductors, catalysts, and corrosion resistant coating.

Recently, a new high dielectric material composition Zr—Sn—Ti—Ox (zirconium tin titanate or ZTT) and Hf—Sn—Ti—Ox (hafnium tin titanate or HTT) were discovered using a composition-spread approach (R. B. van Dover et al, Nature, (1998), vol. 392, p. 162–164; R. B. van Dover et al., IEEE Electron Device Letters, (1998), vol. 19, p. 329–331; L. F. Schneemeyer et al. Appl. Phys. Lett., (1999), vol. 75, p. 1967–1969). Amorphous ZTT and HTT thin films deposited by on-axis reactive sputtering, a physical vapor deposition (PVD), have excellent dielectric properties—high dielectric constants (greater than 20, preferably 40–70) and low leakage—and are considered promising materials for storage capacitors in dynamic random access memory (DRAM) device applications.

As the size of IC devices becomes aggressively smaller, thin films deposited by CVD demonstrates an advantage over PVD method in terms of conformal coverage on various non-planar surfaces. In general, liquid precursors are preferred for CVD applications due to the ease and reproducibility in precursor delivery.

In this study, a new CVD process was developed to deposit ZTT and HTT thin films by directly injecting liquid precursor mixtures that contains all three metals without solvent.

Common precursor delivery methods used in CVD processing include vapor draw, bubbling with carrier gas, mist droplet (aerosol) delivery, and direct liquid injection (DLI). DLI is particularly a preferred method for the delivery of multi-components because it delivers the same ratio of constituents to the reactor as are in the source container. DLI has the added advantage of storing the precursor at room temperature and heating only the amount required to be delivered, and therefore, improving precursor shelf life.

In this invention, the volatile components are chosen such that:

1) They are chemically compatible, therefore, no non-volatile polymeric or multinuclear species are formed.

2) No precipitates are generated due to ligand exchange on the metals or inter ligand reactions.
3) The mixtures maintain low viscosity and thermal stability.
4) Undesired redox chemistry will not take place (eg. $M^{+1}+M^{+3} \rightarrow M^{+2}+M'^{+2}$).

Liquid mixtures can be prepared either by directly mixing liquid metal complexes or dissolving solid metal complex(es) in liquid metal complex(es). In these systems, no solvent is needed to dissolve or dilute the precursor mixtures to achieve a total liquid phase of the resulting mixtures. A broad range of MOCVD precursor solutions using organic solvents have previously been claimed as precursors for thin film depositions. Our new non-solvent containing precursor mixtures lower the burden of abatement of the CVD effluent in the exhaust because there is no extra volatile organic medium to be collected after the CVD processing. Besides, since no solvent is used in the liquid mixtures described herein, high throughput of metal containing vapor can be delivered into the CVD reactor. Thus, the overall CVD process using these new liquid precursor mixtures is more environmentally benign and cost effective than liquid injection delivery of precursor solutions stated in the prior art. A limited scope of similar concept has been disclosed previously using β-diketonate metal complexes. Gordon, et. al., disclosed that liquid barium, strontium, calcium metal complexes could be prepared by complexing metal ions with a mixture of various alkyl substituted β-diketonate ligands thereby ensuring that no single discrete metal complex were yielded in any appreciable quantity. Most recently, CVD of barium strontium titanate (BST) thin films by DLI using a mixture of Ba, Sr, Ti β-diketonate complexes without solvent has been reported (J.-H. Lee et al. Electrochem. Solid-State Lett. (1999), vol. 2, p. 510–511). High viscosity (120 centipoise(cp) at 120° C.) and low volatility of the BST precursor mixture complicates the precursor delivery. In addition, the ligand exchange among these precursors may lead to precursor condensation or precipitation in the course of precursor delivery. The ZTT and HTT precursors used in our study are water-like low viscosity materials at room temperature and have sufficient volatility at a relatively low temperature and can be easily delivered into a CVD system.

The multi-component precursors are selected from the group consisting of, but not limited to, metal alkyls, metal alkoxides, metal halides, metal hydrides, metal amides, metal, imides, metal azides, metal cyclopentadienyls, metal carbonyls, metal nitrates, metal thiolates, metal carboxylates, metal phosphates, metal β-diketonates, metal β-ketoiminates, and metal β-diiminates, and their fluorine and other substituted analogs and mixtures thereof. The ligand associated with each metal should be the same to avoid ligand exchanges which might result in non-liquid conditions.

Appropriate choice of precursors, in the presence of oxygen containing reactant (oxidant), would provide mixed metal oxides. The oxygen containing reactant can be selected from the group of oxygen, ozone, nitrous oxide, nitric oxide, nitrogen dioxide, water, hydrogen peroxide, air and mixtures thereof.

In addition to thermal CVD, the above precursors could be used for plasma, photo, or laser enhanced CVD deposition, well recognized deposition techniques, or by atomic layer epitaxy. In atomic layer epitaxy, an approximately single layer of precursor molecules are first adsorbed on a surface. A reactant is then dosed onto this first precursor layer followed by a reaction between the reactant and the first precursor already on the surface. This alternating procedure is then repeated to provide the desired thickness of element or compound in a near atomic thickness layer.

Furthermore, appropriate choice of liquid mixture precursors may also be applied to sol-gel processing and spin coating of films.

The XSnTi oxide films may be subjected to a thermal treatment of deposited XSnTi oxide thin films, where X=Zr or Hf, to improve electrical properties of the films, comprising annealing said films at a temperature in the range of approximately 200–500° C., with or without ultraviolet (UV) or plasma energy, in an anneal gas selected from the group consisting of $N_2$, Ar, He, $O_2$, $O_3$, $N_2O$, NO, $H_2O$, $H_2O_2$ and mixtures of thereof and conducting the annealing for a time in the range of approximately 1–60 min.

For ZrSnTi compounds, the ratio of Zr:Sn:Ti= 0.1–0.3:0.1–0.3:0.4–0.8.

For HfSnTi compounds, the ratio of Hf:Sn:Ti= 0.05–0.30:0.01–0.20:0.50–0.94.

Appropriate reaction conditions of elevated temperature are approximately 150–600° C. More preferably, the appropriate reaction conditions of elevated temperature are approximately 200–500° C. The solventless liquid mixture may be introduced into the reaction zone and vaporized at a temperature of approximately 50–200° C. More preferably, the temperature is approximately 80–120° C. The reaction zone pressure may be approximately 0.01–50 Torr. More preferably, the pressure is approximately 0.1–5 Torr. The deposition rate of the thin film is in the range of approximately 1 to 300 angstoms per minute. Post-deposition, the films are annealed at a temperature in the range of approximately 200–500° C., in an anneal gas selected from the group consisting of $N_2$, Ar, He, $O_2$, $O_3$, $N_2O$, NO, $H_2O$, $H_2O_2$ and mixtures of thereof for 1 to 60 minutes to improve their electrical properties as shown in FIG. 1. Annealed films are compared against non-annealed films, wherein the annealed films show consistently lower leakage current rates required of materials in electronic structures. Preferably, the films are annealed under $N_2$ atmosphere at 400° C. for 30 min.

Such films can be used as storage capacitors for dynamic random access memory devices.

The present invention will be illustrated in greater detail with several specific examples.

EXAMPLE 1

CVD of ZrSnTiOx from Metal Amides

A solventless mixture $Zr(N(CH_2CH_3)_2)_4$, $Sn(N(CH_2CH_3)_2)_4$, and $Ti(N(CH_2CH_3)_2)_4$ (molar ratio Zr:Sn:Ti=0.2:0.2:0.6) metal-ligand complex precursors was delivered at 0.06 ml per minute to a direct liquid injection system with a vaporization temperature of 110° C. using a helium sweep gas of 160 sccm with an oxygen flow of 17 or 100 sccm, onto a wafer substrate target for mixed metal compound film deposition where the wafer was held at 240 or 300° C. The deposition rate ranged from 100 to 300 angstroms per minute. The reactor chamber pressure was 2 Torr. Rutherford Backscattering Spectrometry (RBS) analysis of the films deposited from the precursor mixture under these conditions by CVD demonstrated that films were Zr—Sn—Ti oxides consisting of the metal composition ratio given below. The capacitance-voltage measurement of the films demonstrated that the dielectric constants of the films are greater than 20.

TABLE 1

Normalized metal content

| Dep. Temp. | O2 flow | Ti | Zr | Sn |
|---|---|---|---|---|
| 240 | 17 | 0.56 | 0.41 | 0.04 |
| 240 | 100 | 0.58 | 0.36 | 0.06 |
| 300 | 17 | 0.72 | 0.17 | 0.11 |
| 300 | 100 | 0.72 | 0.17 | 0.11 |
|  | Ideal | 0.6 | 0.2 | 0.2 |

EXAMPLE 2

CVD of ZrSnTiOx from Metal Alkoxides

A solventless mixture Zr(t-butoxide)$_4$, Sn(t-butoxide)$_4$, and Ti(t-butoxide)$_4$ (molar ratio Zr:Sn:Ti=0.2:0.2:1.0) metal-ligand complex precursors was delivered at 0.06 ml per minute to a direct liquid injection system with a vaporization temperature of 110° C. using a helium sweep gas of 160 sccm with an oxygen flow of 100 sccm and additional helium of 0 to 150 sccm, onto a wafer substrate target for mixed metal compound film deposition where the wafer was held at 300° C. The deposition rate ranged from 20 to 80 angstroms per minute. The reactor chamber pressure was 2 Torr. Energy dispersive X-ray (EDX) analysis of the films deposited from the precursor mixture under these conditions by CVD demonstrated that Zr, Sn, Ti metals were incorporated in the deposited films. The capacitance-voltage measurement of the films demonstrated that the dielectric constants of the films are greater than 20 as deposited.

EXAMPLE 3

Thermal Anneal of ZrSnTiOx Thin Films Deposited from Metal Alkoxides

The ZrSnTiOx thin films deposited from a solventless mixture Zr(t-butoxide)$_4$, Sn(t-butoxide)$_4$, and Ti(t-butoxide)$_4$ (molar ratio Zr:Sn:Ti=0.2:0.2:1.0) in Example 2 were annealed under N$_2$ atmosphere at 400° C. for 30 min. The dielelectric constant of the films increased to 38 after the anneal.

EXAMPLE 4

Leakage Current of ZrSnTiOx Thin Films Deposited from Metal Alkoxides

The electrical properties of the ZrSnTiOx thin films deposited from a solventless mixture Zr(t-butoxide)$_4$, Sn(t-butoxide)$_4$, and Ti(t-butoxide)$_4$ (molar ratio Zr:Sn:Ti= 0.2:0.2:1.0) in Example 2 were characterized as shown in FIG. 1. TiN bottom electrode and Ag top electrode were used for the I-V (current-voltage) measurement. The leakage current of the as-deposited films decreased after the thermal anneal at 400° C. for 30 min under N$_2$.

EXAMPLE 5

CVD of ZrSnTiOx from Metal Amides

A solventless mixture Zr(N(CH$_3$)$_2$)$_4$, Sn(N(CH$_3$)$_2$)$_4$, and Ti(N(CH$_3$)$_2$)$_4$ (molar ratio Zr:Sn:Ti=0.2:0.2:1.0) metal-ligand complex precursors was delivered at 0.06 ml per minute to a direct liquid injection system with a vaporization temperature of 110° C. using a helium sweep gas of 160 sccm with an oxygen flow of 100 sccm and additional helium of 0 to 150 sccm, onto a wafer substrate target for mixed metal compound film deposition where the wafer was held at 300° C. The deposition rate ranged from 20 to 80 angstroms per minute. The reactor chamber pressure was 2 Torr. Energy dispersive X-ray (EDX) analysis of the films deposited from the precursor mixture under these conditions by CVD demonstrated that Zr, Sn, Ti metals were incorporated in the deposited films. The capacitance-voltage measurement of the films demonstrated that the dielectric constants of the films are greater than 20.

HfTT films were also studied successfully in a similar manner as the ZrTT films identified above.

The present invention achieves desirable deposition of CVD films having high dielectric properties which overcomes the processing problems of the prior art by providing solventless CVD processing using mixed metal ligands with common ligand functionality. The dielectric constant of the film is enhanced further by a post-deposition anneal with or without ultra violet radiation or plasma energy. This successfully overcomes the problems in providing mixed metal high dielectric films for electronic structures in electronic devices.

The present invention has been set forth with regard to several preferred embodiments, but the full scope of the present invention should be ascertained from the several claims below.

What is claimed is:

1. A process for the deposition of a XSnTi oxide containing thin film from a solventless liquid mixture of X(L)$_4$, Sn(L)$_4$ and Ti(L)$_4$ containing precursors, where X=Zr or Hf, comprising;

(a) providing said X(L)$_4$, Sn(L)$_4$ and Ti(L)$_4$ containing precursors in said solventless liquid mixture, wherein L is selected from the group consisting of alkyls, alkoxides, halides, hydrides, amides, imides, azides, cyclopentadienyls, carbonyls, carboxylates, thiolates, nitrates, phosphates, β-diketonates, β-ketoiminates, and β-diiminates;

(b) introducing said solventless liquid mixture into a reaction zone and adjacent a substrate upon which said thin film is to be deposited, along with an oxygen containing reactant;

(c) depositing said thin film of XSnTi oxide having a dielectric constant greater than 20 on said substrate;

(d) annealing said thin film at a temperature in the range of approximately 200–500° C., in an anneal gas selected from the group consisting of N$_2$, Ar, He, O$_2$, O$_3$, N$_2$O, NO, H$_2$O, H$_2$O$_2$ and mixtures of thereof.

2. The process of claim 1 wherein X=Zr and said thin film has a molar ratio of Zr:Sn:Ti=0.1–0.3:0.1–0.3:0.4–0.8.

3. The process of claim 1 wherein X=Hf and said thin film has a molar ratio of Hf:Sn:Ti= 0.05–0.30:0.01–0.20:0.50–0.94.

4. The process of claim 1 wherein said depositing is at an elevated temperature of approximately 150–600° C.

5. The process of claim 4 wherein said elevated temperature is approximately 200–500° C.

6. The process of claim 1 wherein said solventless liquid mixture is introduced into said reaction zone and vaporized at a temperature of approximately 50–200° C.

7. The process of claim 6 wherein said temperature is approximately 80–120° C.

8. The process of claim 1 wherein said reaction zone has pressure of approximately 0.01–50 Torr.

9. The process of claim 8 wherein said pressure is approximately 0.1–5 Torr.

10. The process of claim 1 wherein the deposition rate of said thin film is in the range of approximately 1 to 300 angstoms per minute.

11. The process of claim 1 wherein said XSnTi oxides are annealed with an energy source selected from the group consisting of heat, ultraviolet radiation, plasma and combinations thereof.

12. A process for the deposition of a XSnTi oxide containing thin film, where X=Zr or Hf, from a solventless liquid mixture of, $X(L)_4$, $Sn(L)_4$, $Ti(L)_4$ where L=OR or $NR_2$, and R=H or $C_1$–$C_6$ alkyls and substituted alkyls comprising;

(a) providing $X(L)_4$, $Sn(L)_4$, $Ti(L)_4$ as said solventless liquid mixture;

(b) introducing said solventless liquid mixture into a reaction zone and adjacent a substrate upon which said thin film is to be deposited, along with an oxygen containing reactant;

(c) depositing said thin film of said XSnTi oxides having a dielectric constant greater than 20 on said substrate at an elevated temperature;

(d) annealing said thin film at a temperature in the range of approximately 200–500° C., in an anneal gas selected from the group consisting of $N_2$, Ar, He, $O_2$, $O_3$, $N_2O$, NO, $H_2O$, $H_2O_2$ and mixtures of thereof.

13. The process of claim 12 wherein said oxygen containing reactant is selected from the group consisting of oxygen, ozone, nitrous oxide, nitric oxide, nitrogen dioxide, water, hydrogen peroxide, air and mixtures thereof.

14. The process of claim 12 wherein said XSnTi oxides are annealed with an energy source selected from the group consisting of heat, ultraviolet radiation, plasma and combinations thereof.

15. The process of claim 12 wherein said annealing is conducted for a time in the range of approximately 1–60 min.

16. The process of claim 15 where said annealing is conducted for a time in the range of 5–30 min.

17. The process of claim 15 wherein said annealing is performed at a temperature in the range of approximately 350–450° C.

18. The process of claim 12 wherein said thin film of XSnTi oxides are deposited as a storage capacitor in a dynamic random access memory device.

* * * * *